(12) United States Patent
Benning et al.

(10) Patent No.: US 6,741,016 B2
(45) Date of Patent: May 25, 2004

(54) FOCUSING LENS FOR ELECTRON EMITTER WITH SHIELD LAYER

(75) Inventors: Paul J. Benning, Corvallis, OR (US); William R Knight, Corvallis, OR (US); Michael J. Regan, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 324 days.

(21) Appl. No.: 09/882,933

(22) Filed: Jun. 14, 2001

(65) Prior Publication Data

US 2002/0193036 A1 Dec. 19, 2002

(51) Int. Cl.[7] .................. H01J 1/46; H01J 21/10; H01J 1/62; G09G 3/10
(52) U.S. Cl. ............. 313/309; 313/306; 313/307; 313/308; 313/310; 313/312; 313/313; 313/293; 313/495; 313/496; 313/497; 313/498; 315/169.1; 315/169.4; 315/167; 445/24; 445/47
(58) Field of Search ............... 313/306, 307, 313/308, 309, 293, 300, 303

(56) References Cited

U.S. PATENT DOCUMENTS

| | | | |
|---|---|---|---|
| 4,760,567 A | | 7/1988 | Crewe |
| 4,923,421 A | | 5/1990 | Brodie et al. ............... 445/24 |
| 5,090,932 A | | 2/1992 | Dieumegard et al. ........ 445/24 |
| 5,191,217 A | * | 3/1993 | Kane et al. ............ 250/423 F |
| 5,223,764 A | * | 6/1993 | Chen ........................ 313/414 |
| 5,440,579 A | | 8/1995 | Molva et al. |
| 5,528,103 A | | 6/1996 | Spindt et al. ............... 313/497 |
| 5,541,473 A | | 7/1996 | Duboc, Jr. et al. ........ 313/422 |
| 5,557,596 A | * | 9/1996 | Gibson et al. .............. 369/101 |
| 5,619,097 A | * | 4/1997 | Jones ......................... 313/495 |
| 5,850,120 A | | 12/1998 | Okamoto |
| 5,877,594 A | | 3/1999 | Miyano et al. ............ 315/169.1 |
| 6,008,576 A | | 12/1999 | Nakatani et al. ........... 313/495 |
| 6,096,570 A | | 8/2000 | Hattori ........................ 438/20 |
| 6,137,213 A | | 10/2000 | Moyer et al. ............... 313/309 |
| 6,137,272 A | | 10/2000 | Liu et al. ..................... 313/308 |
| 6,139,760 A | * | 10/2000 | Shim et al. .................. 216/24 |
| 6,153,978 A | | 11/2000 | Okamoto .................. 315/169.3 |

OTHER PUBLICATIONS

Lee, Jin Ho, et al. "Fabrication and characterization of silicon field emitter arrays with focusing electrode by the chemical mechanical polishing process." J. Vac. Sci. Technol. B 16(2) Mar./Apr. 1998, 811–814.

Endo, Yasuhiro, et al. "Microelectron gun with silicon field emitter." J. Vac. Sci. Technol. B 16(6), Nov./Dec. 1998, 3082–3085.

Itoh, Junji, et al. "Fabrication of double–gated Si field emitter arrays for focused electron beam generation." J. Vac. Sci. Technol. B 13(5), Sep./Oct. 1995, 1968–1972.

* cited by examiner

Primary Examiner—Ashok Patel
Assistant Examiner—Matt Hodges
(74) Attorney, Agent, or Firm—Timothy F. Myers

(57) ABSTRACT

An electron lens is used for focusing electrons from a cathode to an anode. The lens includes a first conductive layer with a first opening at a first distance from the cathode. The first conductive layer is held at a first voltage. The lens also includes a second conductive layer with a second opening at a second distance from the first conductive layer and a third distance from the anode. The second conductive layer is held at a second voltage substantially equal to the voltage of the anode. The first and second openings are chosen based on the first voltage, the second voltage, the first distance, the second distance and the third distance. The opening focuses the electrons emitted from the cathode onto the anode to a spot size preferably less than 40 nanometers. The force created between the cathode and anode is minimized by the structure of the lens.

62 Claims, 7 Drawing Sheets

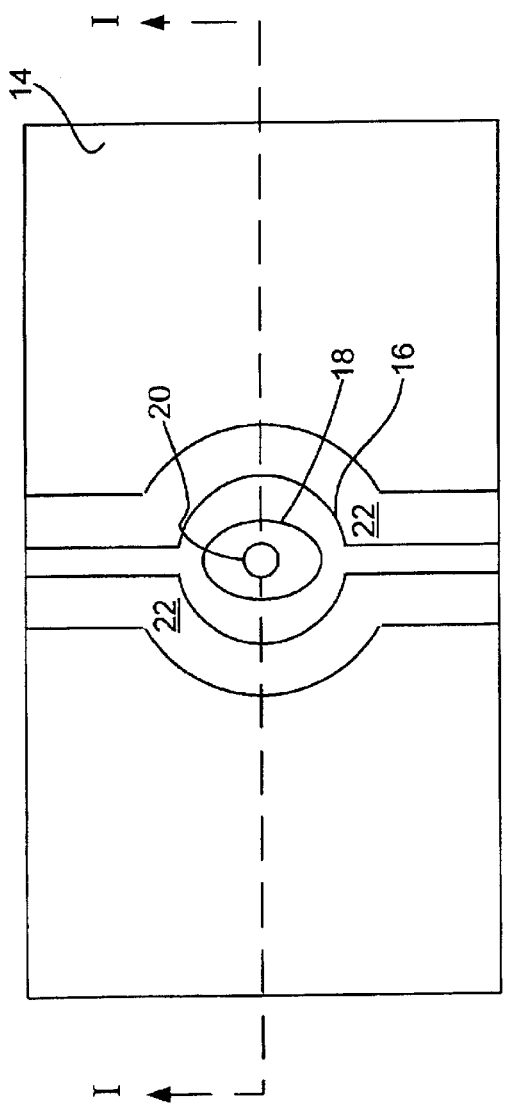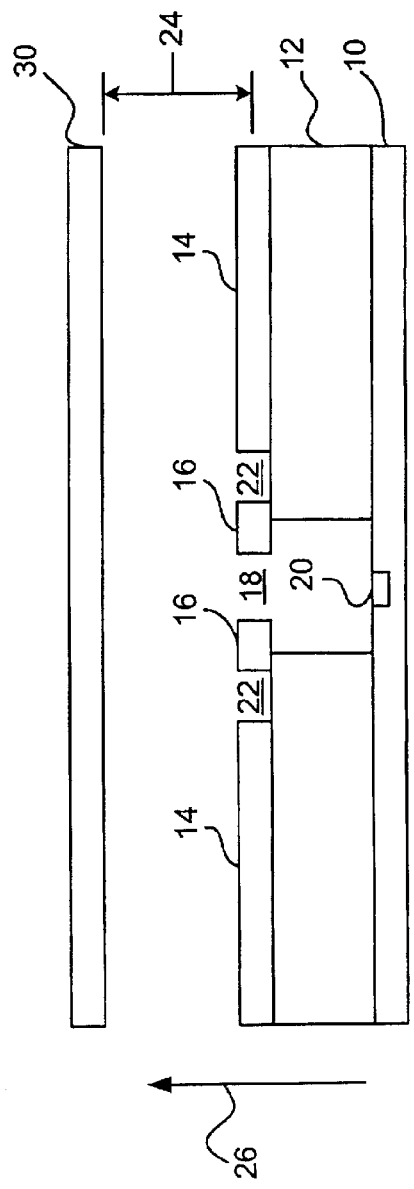
Fig. 1A
Fig. 1B

FOCUSING LENS FOR ELECTRON EMITTER WITH SHIELD LAYER

BACKGROUND OF THE INVENTION

The present invention relates to lens design for electron emitters, particularly those electron emitters used in mass storage and display devices often incorporated in many electronic devices.

Computing technology continues to become less expensive while providing more capability. To allow computing technology to continue these positive trends, peripheral devices such as mass storage devices and display devices must continue to advance. Much criticism has been voiced in the trade press about the lack of mass storage devices such as disk drives, CD-ROMs, and DVD drives, to name a few, to keep up with the advancing speed of the microprocessors found in contemporary personal computers. Hard disk drives, for example, have been able to increase the storage density tremendously over the last decade but are now encountering physical limitations that prevents further progress. Although some hard disk drives have been miniaturized to operate with portable devices, the high power requirements still limit longer term battery operation. A more energy efficient, high density storage device is needed.

Display devices, such as LCD monitors have had difficulty in fulfilling demand due to the complexity of manufacturing them with near-zero defects. Further, the use of passive LCD technology has required the addition of backlights to allow for viewing in different ambient light conditions. These backlights require additional power thereby further limiting long term battery operation.

Electron beam technology has been present for many years in consumer products such as television (TV) tubes and computer monitors. These devices use what is known as hot cathode electrodes to create a source of electrons that are directed to and focused on the viewing screen. While research has taken place in a number of new technological fields, the field of cold cathode electron emitters such as spindt-tips and flat emitters has attracted the attention of many manufacturers. Several problems exist in converting this cold cathode technology to products. One such problem is the creation of an electron focusing structure that can be used in multiple applications that require a high density of emitting devices such as with mass storage and display devices. Usually, these applications require a high voltage potential between the electron-generating source (commonly called a cathode) and the media or viewing surface (commonly called an anode). When making compact devices, however, only a very short distance will separate the anode and cathode. This short distance makes it difficult to achieve a consistent tight focus of the electrons from the cathode source onto the anode. If a consistent tight focus is achievable, higher storage densities are possible because of smaller bit distances. Because the anode and cathode are held at differentially high voltage potentials, an electrostatic force created by the high voltage potential creates an attractive force between them. This attractive force creates additional problems, especially with movable components which must overcome this force, such as the media surface mass storage devices. In fact, a motor controlling the media surface must consume additional power, thereby affecting battery life in portable products. In display devices, this unwanted force could create undesired flexing or torsional stress. Unless this undesirable attractive force is reduced or eliminated, the use of cold cathode electron emitting technology may be delayed. Therefore, a need exists for a new lens structure that minimizes the attractive force between the anode and cathode structures while also maintaining tolerance to manufacturing process variations.

SUMMARY OF THE INVENTION

An electron lens is used for focusing electrons from a cathode to an anode. The lens includes a first conductive layer with a first opening at a first distance from the cathode. The first conductive layer is held at a first voltage. The lens also includes a second conductive layer with a second opening at a second distance from the first conductive layer and a third distance from the anode. The second conductive layer is held at a second voltage substantially equal to the voltage of the anode. The first and second openings are chosen based on the first voltage, the second voltage, the first distance, the second distance and the third distance. The force created between the cathode and anode is minimized by the structure of the lens.

BRIEF DESCRIPTION OF THE DRAWINGS

The invention is better understood with reference to the following drawings. The elements of the drawings are not necessarily to scale relative to each other. Rather, emphasis has instead been placed upon clearly illustrating the invention. Furthermore, like reference numerals designate corresponding similar though not necessarily exact parts through the several views.

FIG. 1A is a top view of a focusing electron lens for an electron emitter.

FIG. 1B is a cross-section of the focusing electron lens shown in FIG. 1A along the I—I perspective.

DETAILED DESCRIPTION OF THE PREFERRED EMBODIMENT

Figure 2A:
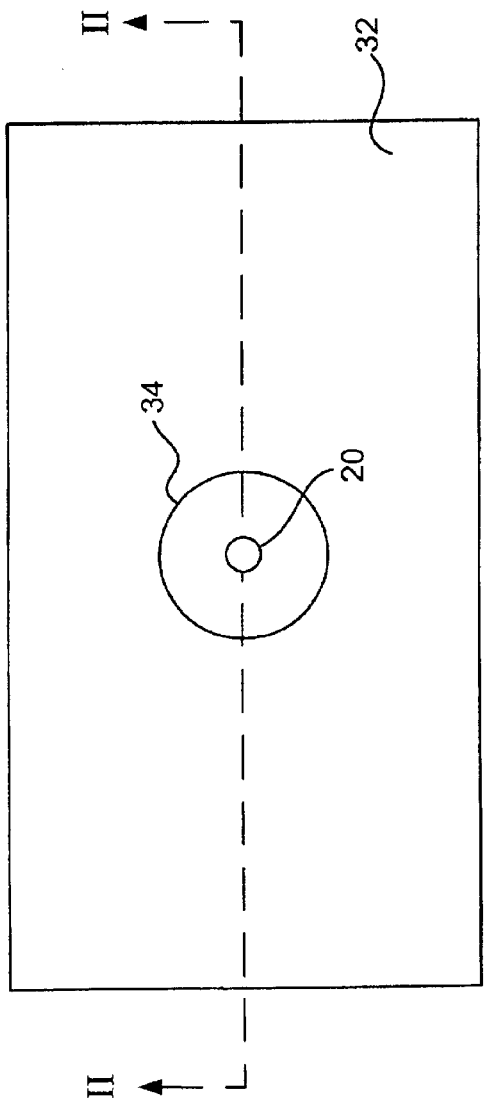
FIG. 2A is a top view of a focusing electron lens that encompasses an embodiment of the invention.

One technique to minimize the attractive forces between cathodes and anodes is to use a co-planer lens and shield as illustrated in the field emission device shown in FIGS. 1A and 1B. FIG. 1A is a top view of the field emission device. FIG. 1B is a cross section of the field emission device in FIG. 1A looking into the I—I perspective along with a representative anode 30. A cathode 10 has an electron emitter 20 disposed on or within it to create a beam of electrons. Disposed on the cathode is preferably a dielectric layer 12 to provide electrical and preferably thermal insulation. On the dielectric layer 12 is disposed a co-planer lens 16 and preferably a co-planer shield 14. Shield-lens spacing 22 separates the co-planer lens 16 and the co-planer shield 14. Within the co-planer lens 16 is a co-planer lens opening 18, which is used to create an electrostatic field that affects the electron beam, preferably by focusing the electron beam from the electron emitter 20 onto an anode 30 that is separated from the co-planer lens 16 and co-planer shield 14 by shield-lens spacing 24. Preferably, the co-planer shield 14 is held at or near the potential of the anode 30 and is used to minimize the attractive force between the anode 30 and cathode 10 structures. Although this structure reduces the attractive force between the anode 30 and cathode 10 structures, an attractive force 26 remains due to the differential voltage potential between the co-planer lens 16 and the anode 30. This attractive force 26 limits the spacing between the anode 30 and cathode 10. When the anode 30 is a media surface, such as with a mass storage device, the motor used to move the media surface must exert more power to overcome the attractive force 26, thereby consuming more power and/or a larger motor. If the anode 30 is a display surface, the attractive force requires thicker display substrates or more spacer material, increasing both product cost and weight. Keeping the anode 30 and the electronic lens separated by a large distance minimizes the attractive force. However, this large distance makes the size of the focused spot on the anode 30 very sensitive to minor variations in the lens and shield geometry, which is affected by manufacturing processes. The expected part-to-part variation caused by the manufacturing process limits the spot size to greater than is needed for several applications.

Figure 2B:
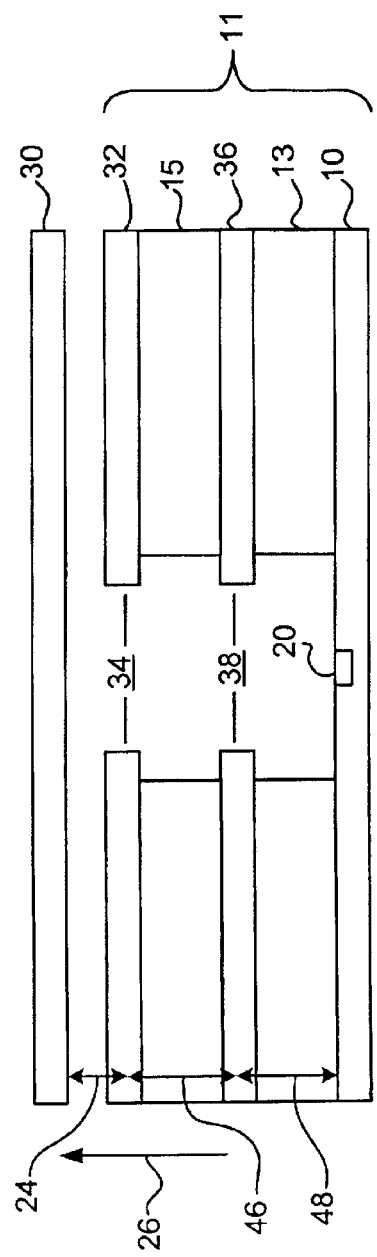
FIG. 2B is a cross-section of the focusing electron lens shown in FIG. 2A along the II—II perspective.

FIGS. 2A and 2B illustrate the architecture and design of an electronic lens that results in less attractive force, preferably less than 0.03 Netwons/cm$^2$, and more tolerance to fabrication process variations. FIG. 2A is a top view of a field emission device that incorporates the lens structure of the invention. FIG. 2B is a cross sectional view of the field emission device shown in FIG. 2A along the II—II perspective and includes the structure of an anode 30. Cathode 10 has an electron emitter 20 located on or within it. The electron emitter creates a beam of electrons that is focused on anode 30 using a lens layer 36 that is located between a shield layer 32 and cathode 10. The shield layer 32 is located between the lens layer 36 and the anode 30. The lens layer 36 has a lens opening 38, which is used to focus the electron beam onto anode 30. The shield layer 32 has a shield opening 34, preferably the same diameter as lens opening 38 that allows the electron beam to pass between through the shield layer 32 onto anode 30. The lens layer 36 is disposed on preferably a first dielectric layer 13. The shield layer 32 is disposed preferably on a second dielectric layer 15. The lens layer 36, first dielectric layer 13 and second dielectric layer 15 and the shield layer 32 are preferably integrated onto cathode 10 using semiconductor or display thin-film technology thereby creating a cathode structure 11. The lens layer 36 is separated from the cathode 10 by a first distance 48. The shield layer 32 is separated from the lens layer 36 by a second distance 46. The shield layer 32 is separated from the anode 30 by a third distance 24.

Preferably, the sum of second distance 46 and third distance 24 is within about one to about two times the distance of first distance 48. For instance, in one embodiment, the first distance 48 and the second distance 46 are substantially equal to each other and greater than the third distance 24, which separates the anode 30 from the cathode structure 11. The lens opening 38 and the shield opening 34 dimensions are chosen such that the electrons emitted from the electron emitter 20 forms a spot image on the anode 30 that is less than 40 nanometers. The spot size is also affected by voltages applied to the lens layer 36, shield layer 34 and anode 30 with respect to the voltage applied to cathode 10. The voltages applied to the different layers will also affect the attractive force 26.

Figure 3:
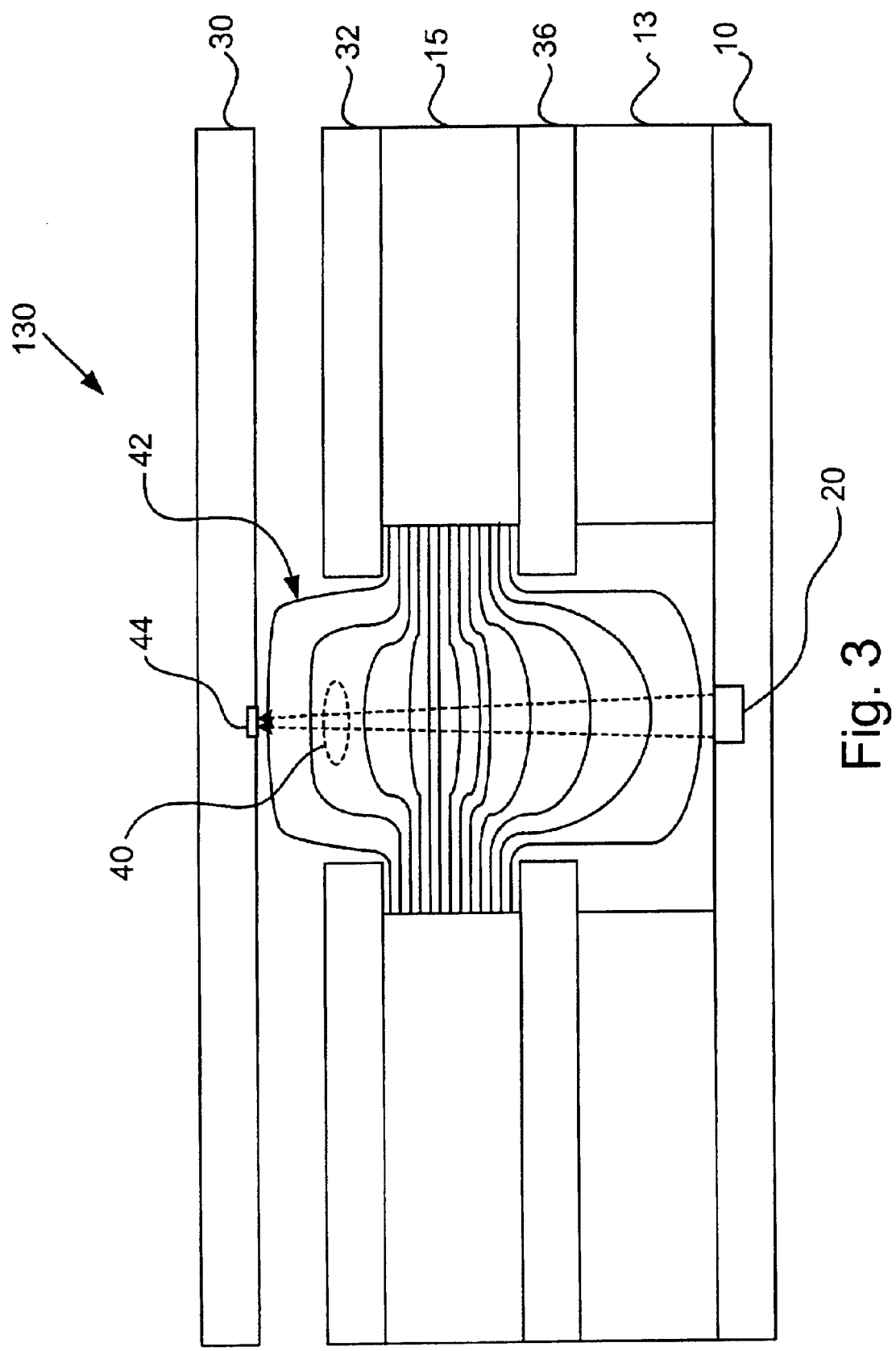
FIG. 3 is an illustration of the focusing electron lens shown in FIG. 2A in operation and representative equipotential surfaces.

For example, FIG. 3 illustrates exemplary electric field 42 established for the electronic lens on the field emission device of FIGS. 2A and 2B. The electrostatic forces created by applying different voltages to the cathode 10, lens layer 36, shield 32 and the anode 30 create the electric field 42. By creating the electric field 42, the field emission device 20 becomes a focused electron emitter 130. The electric field 42 modifies the direction of the electron beam emitted by electron emitter 20 to create a focused beam 40 that creates an image spot 44 on anode 30. Preferably, the materials of first dielectric layer 13 and second dielectric layer 15 are chosen to minimally affect the electric field 42. The first dielectric layer 13 and second dielectric layer 15 can be the same or different dielectric material.

The electron lens and emitters are preferably fabricated with semiconductor device technology. The devices of the present invention are applicable to a broad range of semiconductor devices technologies and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also advantageously be employed in gallium arsenide, germanium, and other semiconductor materials. Accordingly, the present invention is not intended to be limited to those devices fabricated in silicon semiconductor materials, but will include those devices fabricated in one or more of the available semiconductor materials and technologies available to those skilled in the art, such as thin-film-transistor (TFT) technology using polysilicon on glass substrates.

It should be noted that the drawings are not true to scale. Further, various parts of the active elements have not been drawn to scale. Certain dimensions have been exaggerated in relation to other dimensions in order to provide a clearer illustration and understanding of the present invention.

In addition, although the embodiments illustrated herein are shown in two-dimensional views with various regions having depth and width, it should be clearly understood that these regions are illustrations of only a portion of a device that is actually a three-dimensional structure. Accordingly, these regions will have three dimensions, including length, width, and depth, when fabricated on an actual device. Moreover, while the present invention is illustrated by preferred embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to presently preferred embodiments.

Figure 4:
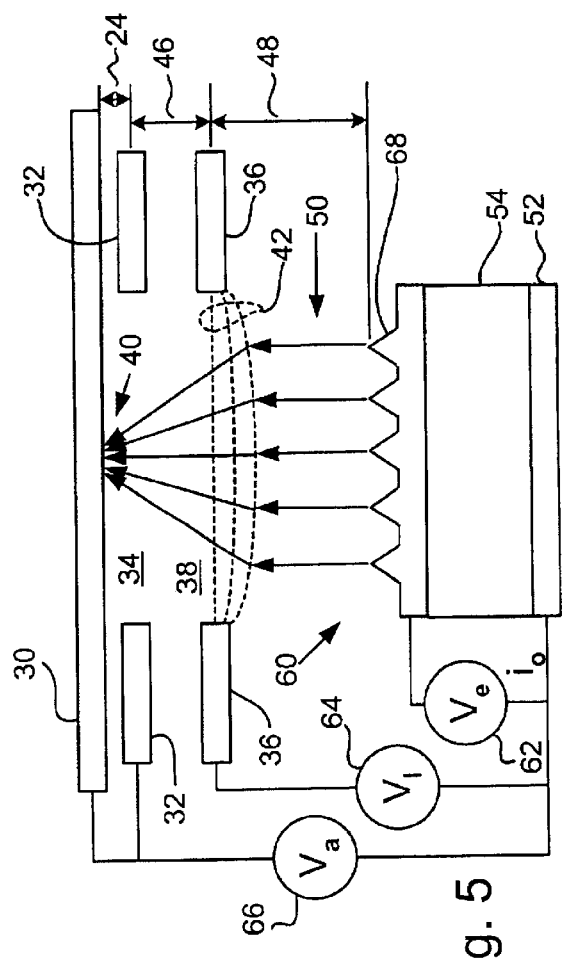
FIG. 4 is an illustration of a first embodiment of the invention with a flat emitter cathode.

FIG. 4 is an exemplary illustration of a first embodiment of the invention using a flat emitter 21 as an electron source. The flat emitter 21 has a flat emitter cathode 58 that is separated from a substrate 54, preferably a silicon substrate although other conductive substrates are usable, by a insulator layer 56 such as $TiO_x$, SiC, or SiN to name a few. Several other insulator layer materials exist and are known to those skilled in the art. An emitter voltage source 62 is connected to the substrate 54 through contact 52 and to the flat emitter cathode 58. The voltage applied is typically 5–20 volts and this potential creates a tunneling of electrons across the insulating layer 56. A sufficient number of tunneled electrons have sufficient energy to escape the flat emitter cathode 58 to create an electron emission 50. A lens layer 36 is located a first distance 48 from the flat emitter cathode 58, for example about 5 micrometers. The lens layer 36 is connected to lens voltage source 64. The voltage applied to the lens layer is used to create an electric field 42 in lens opening 38 to focus the electron emission 50 from the flat emitter cathode 58. For example, preferably the voltage of lens layer 36 is set to about 0 volts. A shield layer 32 is placed between the lens layer 36 and the anode 30, such as a display or media surface, at a second distance, for example about 5 micrometers. The anode 30 is disposed over the shield layer 32 at a third distance 24, for example about 2 micrometers or less. Preferably the shield layer 32 and the anode 30 are connected to the same anode voltage source 66 as shown, preferably more than 500 volts, for example about 700 volts. Optionally, the shield layer 32 and the anode 30 can have a small voltage differential to account for voltage drops or other losses that are frequently encountered in fabricating electrical circuits. Also, by slightly adjusting the differential voltage between the shield layer 32 and anode 30 the focusing can be fine tuned. By having the shield layer 32 and the anode layer 30 at substantially the same voltage potential, the amount of electrostatic attractive force between the anode and cathode is minimized to allow for the close anode 30 to shield layer 32 third spacing 24.

Figure 5:
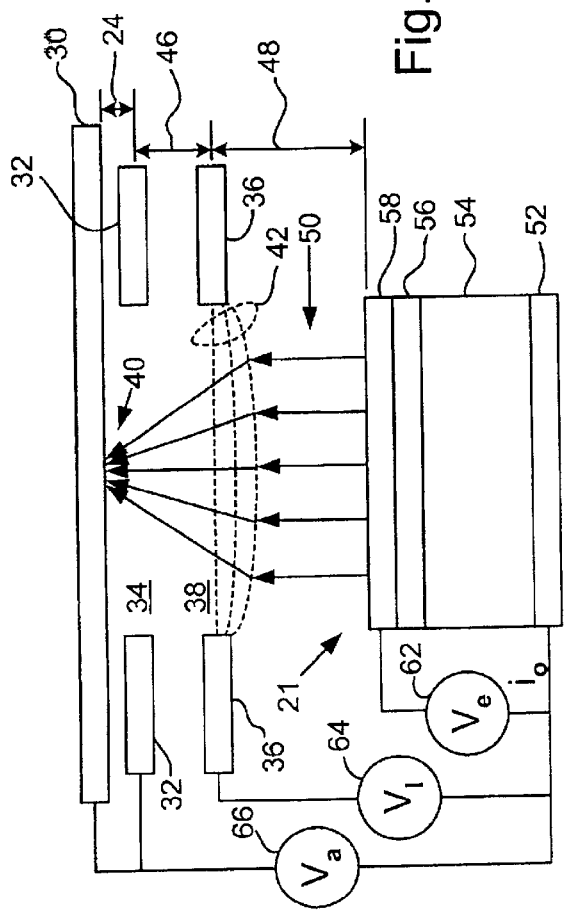
FIG. 5 is an illustration of a second embodiment of the invention with a plurality of spindt-tip electron emitters.

FIG. 5 is a second embodiment of the invention in which the electron emitter is a group of one or more spindt-tip emitters 60 to create the electron emission 50. The spindt-tip emitters 68 are created on substrate 54, preferably silicon, using any of several processes known to those skilled in the art. The substrate 54 has a contact 52 for providing a reference point for setting the voltages on the spindt-tip emitters 68, lens layer 36, shield layer 32 and anode 30. The spindt-tip emitters 68 are set to an emitter voltage 62, preferably about 5–20 volts. Because of the pointed shape of the spindt-tips, the electric field is increased and electrons are drawn to the tip and emitted to create the electron emission 50. The lens layer 36 has an opening 38 in which the electron emission 50 passes through and is focused to form a focused beam 40 on anode 30, preferably to a spot size of less than 40 nanometers in diameter, and more preferably to less than 10 nanometers. The opening 38 is preferably about 7.2 micrometers in this exemplary embodiment. The lens layer 36 is held at a lens voltage potential 64, preferably about 0 volts but other values can be used depending on the actual dimensions chosen for the construction of the field emission device. Due to the difference in voltage potential between the lens layer 36, the shield layer 32, the anode 30 and the spindt-tip emitters 60, an electric field 42 is created in the area of the lens opening 38. This electric field 42 redirects and focuses the electron emissions 50. The lens layer 36 is disposed at a first distance 48 from the spindt emitter 68 tips. The anode layer 30 is held at an anode voltage potential 66, preferably greater than 500V and more preferably about 700V. This anode voltage potential 66 attracts the electrons onto the surface of anode 30. To prevent electrostatic attraction between the anode and the cathode components, a shield layer 32 is interposed between the lens layer 36 and the anode 30. The shield layer 32 has a shield opening 34 preferably the same geometry and size as lens opening 38. The shield layer 32 is spaced a second distance 46 from the lens layer and a third distance 24 from the anode 30 layer. The first distance is preferably about 5 micrometers for a preferred embodiment. The second distance is preferably substantially the same as the first distance, 5 micrometers, and the third distance is preferably about 2 micrometers or less.

Figure 6:
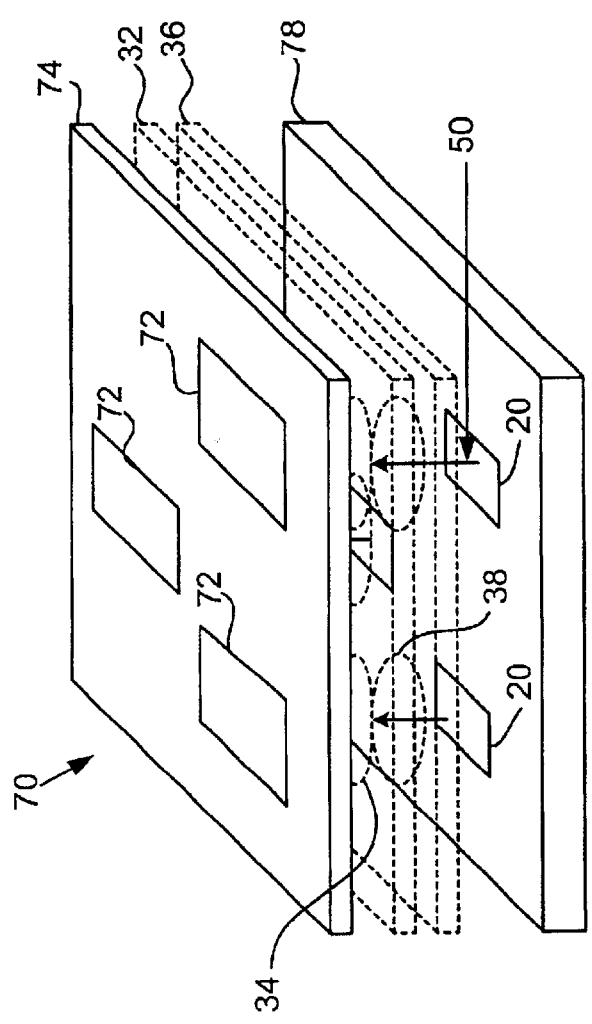
FIG. 6 is an illustration of a third embodiment of the invention used in a display device.

FIG. 6 is a third alternative embodiment of the invention in a conceptual display 70. The display is made up of preferably an array of pixels 72, which further preferably are arranged in a red, blue, green order but could also be a monochromatic color. The pixels 72 are formed on screen 74. An emitter substrate 78 has one or more electron emitters 20, shown as rectangular shaped flat emitters, which are individually controlled to create electron emissions 50. The electron emissions 50 are focused using a lens layer 36 preferably made of a conducting layer of material such as aluminum, gold, or other metal or semiconductor thin-films. The lens layer 36 is disposed between the screen 74 and the emission substrate 78. Typically, the screen 74 is held at a voltage potential greater than 500 volts, such as 700 volts for example, to attract the electron emissions 50. The lens layer 36 has a lens opening 38 that focuses the electron emissions 50 onto a spot size on pixels 72 on screen 74. The lens layer 36 is held at a voltage potential relative to the emitter surface, such as a negative 20 volts, to create an electric field around and in the lens opening 38 to create the electronic lens. The difference in voltage potential between the screen 74 and the emitter substrate 78 and lens layer 36 creates an electrostatic attractive force, which causes the screen 74 to be attracted to the lens layer 36 and the emitter substrate 78. To minimize this attractive force, a shield layer 32 is disposed between the screen 74 and the lens layer 36. The shield layer 32 has shield openings 34, preferably the same geometry and size as lens opening 38, to allow the electron emissions 50 to pass through the shield layer 32 to the screen 74.

Figure 7:
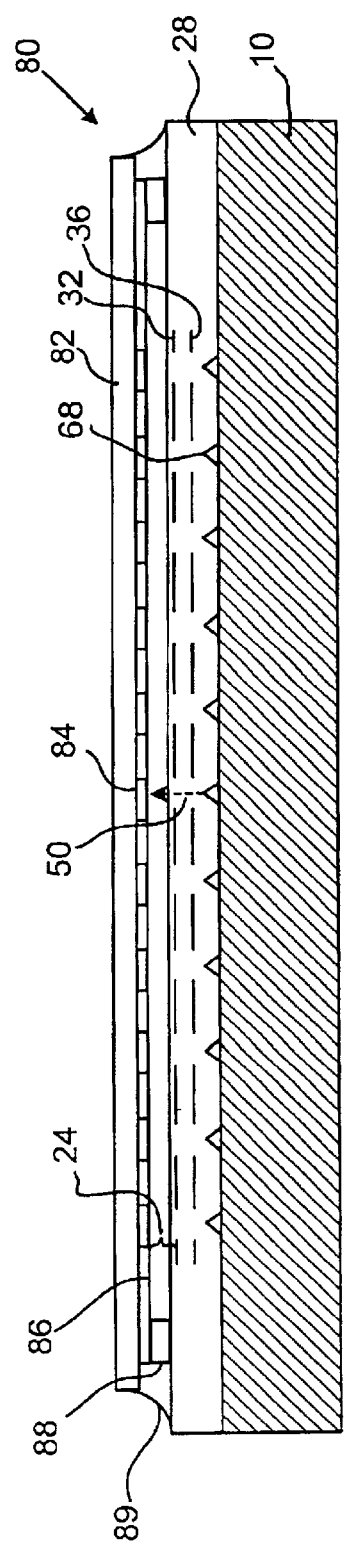
FIG. 7 is an illustration of a fourth embodiment of the invention used in a display device.

FIG. 7 is a fourth alternative embodiment of the invention in the form of an integrated display device 80. The integrated display device 80 is formed of a cathode 10, preferably a silicon substrate but optionally another type of semiconductor or alternatively a glass substrate. Several possible substrates of such materials are known to those skilled in the art. The cathode 10 in this exemplary design has a stack of thin-film layers 28 created on the cathode 10. The stack of thin-film layers 28 incorporates preferably an array of spindt-tip emitters 68, or optionally an array of flat emitters. The spindt-tip emitters 68 are illustrated here as being a single spindt-tip for each pixel phosphor 84, but more than one spindt-tip may be present per pixel phosphor 84. Each spindt-tip 68 is capable of creating an electron emission 50 that is focused with a lens layer 36 embedded within the stack of thin-film layers 28 and disposed between the screen anode 86 and the cathode 10. Also within the stack of thin-film layers 28 is a shield layer 32 that is substantially the same dimensions as the lens layer 36 but held at a different voltage potential, preferably the same as the screen anode 86 voltage potential to reduce electrostatic attraction forces that act upon the screen 82, preferably made of a thin glass or other transparent substrate. The shield layer 32 is interposed between the lens layer 36 and the screen anode 86. The screen 82 is spaced apart from the stack of thin-film layers 28 by a spacer 88 to an anode-shield spacing distance 24. Spacer 88 is selected and fabricated from several optional materials known to those skilled in the art. Preferably, spacer 88 also provides an airtight seal but optionally, an alternative seal 89 or an adhesive can be applied around the periphery of the integrated display device 80.

Figure 8:
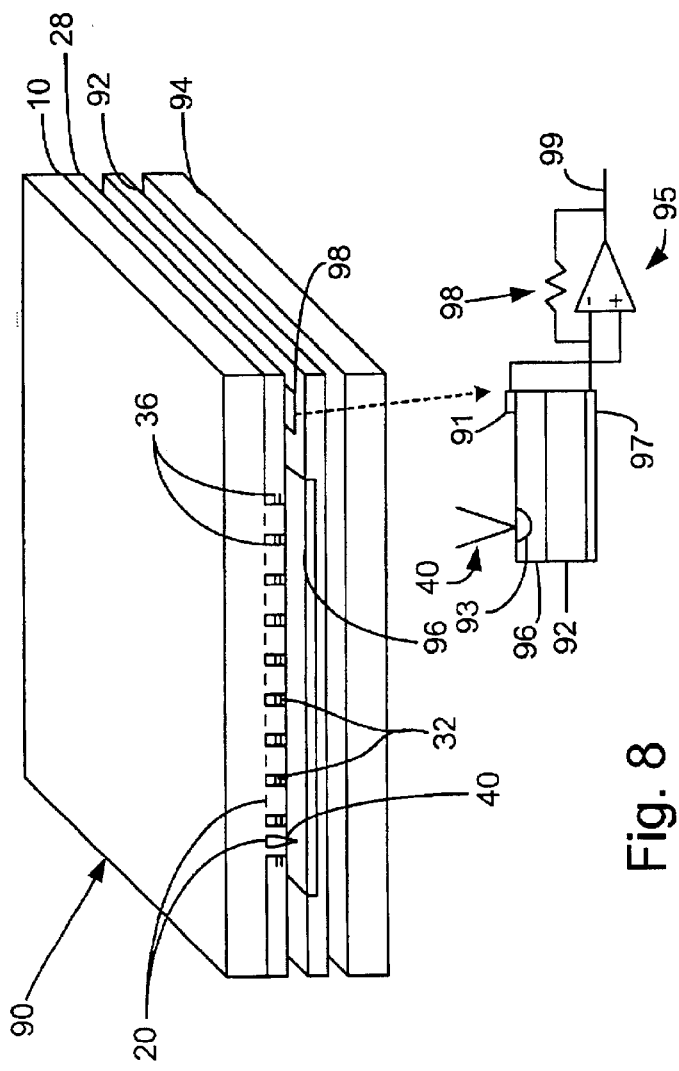
FIG. 8 is an illustration of a fifth embodiment of the invention used in a mass storage device.

FIG. 8 is a fifth embodiment of the invention used in a conceptual mass storage device 90. Conceptual mass storage device 90 is exemplary illustrated as preferably having three substrates arraigned in a vertical stack. An cathode 10 has a stack of thin-film layers 28 formed on one surface that includes electron emitters 20, a lens layer 36 and shield layer 32. The electron emitters 20 and the lens layer creates a focused beam 40 that creates a small spot size, preferably less than 40 nanometers such as about 10 nanometers, on a media surface 96 on a rotor substrate 92 disposed between the cathode 10 and a stator substrate 94. The media surface 96 on rotor substrate 92 is preferably made of a phase-change material that is affected by the energy of the focused beam 40. The phase-change material is able to change from a crystalline to an amorphous state 93 by using a high power level of focused beam 40 and rapidly decreasing the power level of focused beam 40. The phase-change material is able to change from an amorphous state 93 to the crystalline state by using a high power lever of focused beam 40 and slowly decreasing the power level so that the media surface has time to anneal to the crystalline state. An exemplary material is germanium telluride (GeTe) and ternary alloys based on GeTe. Another exemplary material is indium selenium (InSe). Several other phase-change materials are known to those skilled in the art and can be substituted without departing from the scope and spirit of the invention. The rotor substrate 92 and the stator substrate 94 contain electronic circuitry to enable rotor substrate 92 to move in a first and preferably second direction to allow a single electron emitter 20 to read and write multiple locations on the media surface. To prevent the rotor substrate 92 from being attracted to the cathode 10, the stack of thin-film layers includes a shield layer 32 disposed between the lens layer 36 and the rotor substrate 92.

To read from the media surface, a lower-energy focused beam 40 strikes the media surface on media that causes electrons to flow through the media substrate 90 and a reader circuit 98 detects them. The amount of current detected is dependent on the state, amorphous or crystalline, of the media surface struck by the focused beam 40. The operation of an exemplary reader circuit 98 is shown as having a first contact 91 connected to the media surface 96 and a second contact 97 connected to the media substrate 92. Current that flows within the substrate is converted to voltage by amplifier 95 to create a reader output 99. Other reader circuits are known by those skilled in the art and can be substituted without departing from the scope and spirit of the invention.

Figure 9:
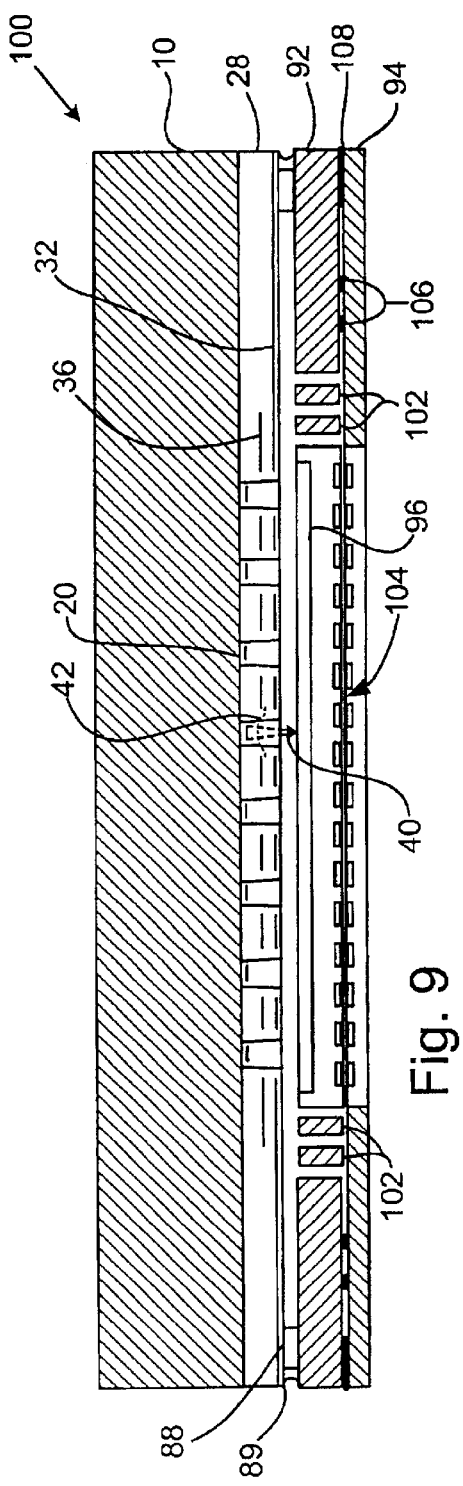
FIG. 9 is an illustration of sixth embodiment of the invention used in a mass storage device.

FIG. 9 is a sixth embodiment of the invention illustrated by an exemplary integrated mass storage device 100. The integrated mass storage device 100 includes three substrates: a cathode 10, a rotor substrate 92, and a stator substrate 94. The rotor substrate 92 has at least one media surface on a portion of the substrate that is able to move in preferably a first and second direction using electrostatic circuits 104, preferably in a step motor type function. The movable media surface 96 is supported by springs 102, preferably formed by etching the rotor substrate. Several different micro-mechanical system (MEMs) architectures are known to those skilled in the art for fabricating the movable media surface 96.

Electrical contact between the stator substrate 94 and the rotor substrate 92 is performed by contacts 106. Preferably, a bonding seal 108 attaches the rotor substrate 92 to the stator substrate 94 and preferably seals the interior to keep an evacuated environment within the integrated mass storage device 100. Also rotor substrate 92 is attached to cathode 10 using a spacer 88 that is also preferably an air-tight seal. Optionally, an alternative seal 89 can be used instead of or in conjunction with spacer 88 to adhere and/or seal cathode 10 to rotor substrate 92.

Cathode 10 includes a stack of thin-film layers 28 that are preferably applied using conventional semiconductor processes. The stack of thin-film layers 28 include a set of electron emitters 20, shown here as flat emitters but spindt-tip emitters could also be used, that are focused using a lens layer 36 that creates an electric field 42 that creates the focused beam 40 on the media surface 96 to a spot size of preferably less than 40 nanometers and more preferably less than 10 nanometers. The lens layer preferably has a lens opening of about 7.2 micrometers. Preferably the space between the cathode 10 and the rotor substrate 92 is evacuated of air to preferably less the $10^{-3}$ Torr to prevent the electrons emitted from the electron emitters 20 from colliding with gas or other particles which could damage the electron emitters 20. The electron emitters 20 are held at a first voltage potential to create the electrons preferably by tunneling techniques. The first voltage potential is preferably less than about 25 volts. The lens layer 36 is held at a second voltage potential, preferably about 0 volts with respect to ground to create the electric field 42 used for focusing the electrons. The media surface 96 is preferably held to a third potential preferably greater than 500 volts, for example about 700 volts, to attract the electrons emitted from the electron emitters 20. The difference in voltage potentials between the media surface 96 and the lens 36 creates an attractive electrostatic force that tends to pull the movable media surface of the rotor substrate 92 towards the cathode 10. The electrostatic motor 104 must overcome this force, thus requiring larger components possibly. Larger components would increase power consumption and increase manufacturing costs. To prevent this need for increased power, adding a shield layer 32 in the stack of thin-film layers between the lens layer 36 and the media surface 96 anode, minimizes this electrostatic attractive force. Preferably, the shield layer 32 is held at about the same voltage as the media surface. The shield layer has preferably the same geometric shape and size openings as the lens layer to minimize the effect of the shield layer on the focused electron beam 40, preferably to a force less than 0.03 Newtons/cm$^2$ per electron emitter 20. Preferably, the lens layer is separated from the electron emitters by a first distance, preferably about 5 micrometers, and the shield layer separated from the lens layer by a second distance, preferably equal to the first distance. By essentially eliminating the electrostatic force between the cathode 10 and the media surface 96 on the anode, the spacing between the media surface 96 to the surface of the cathode 10 can be kept to a minimum distance, such as less than 2 micrometers, to allow for spacer 88 to be deposited using conventional thin-film sputtering technologies.

Figure 10:
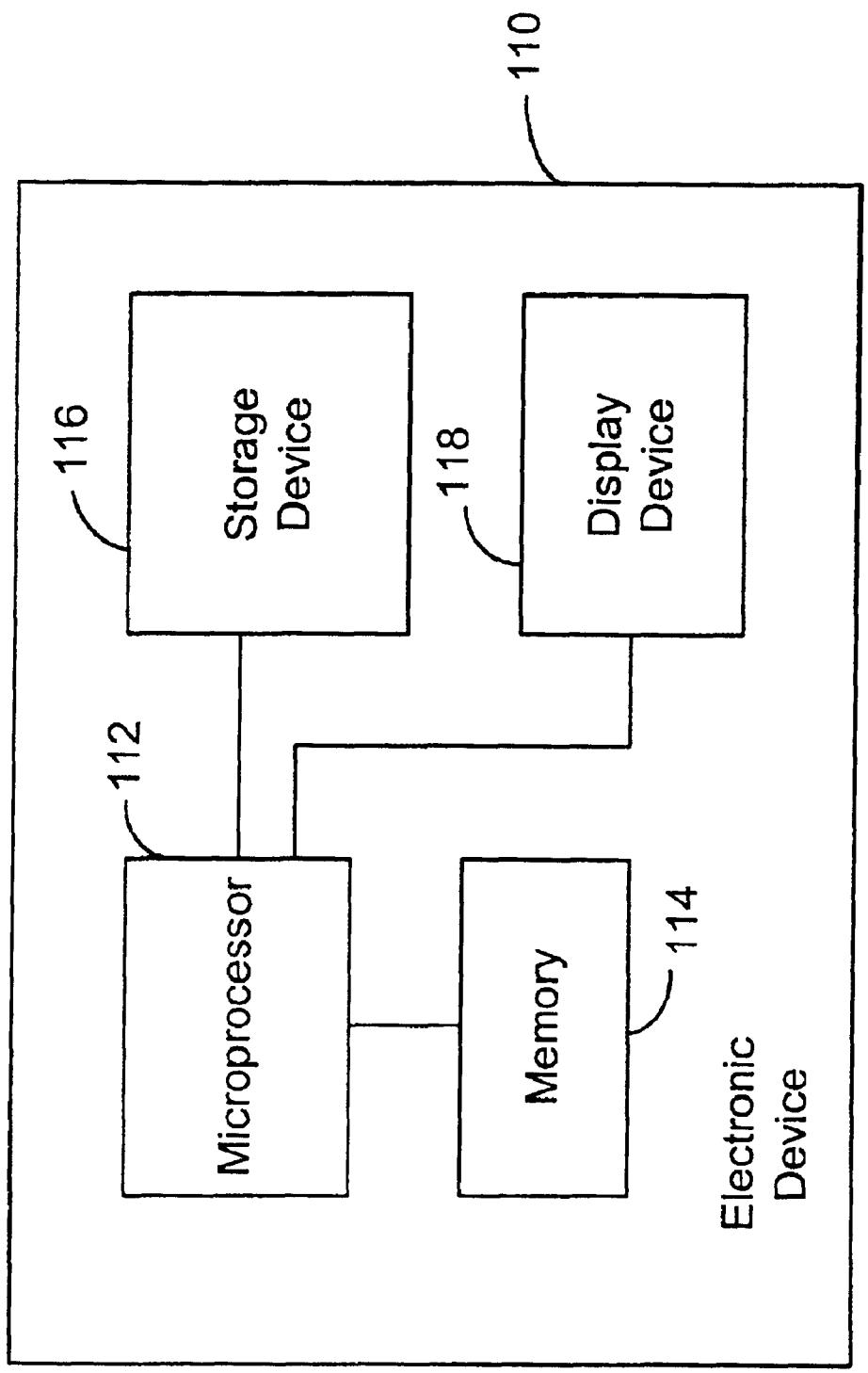
FIG. 10 is a block diagram of an electronic device that includes devices that encompass embodiments of the invention.

FIG. 10 is an exemplary block diagram of an electronic device 110, such as a computer, video game, Internet appliance, terminal, MP3 player, or personal data assistant to name just a few. The electronic device 110 includes a microprocessor 112, such as an Intel Pentium Processor™ or compatible processor although other processors exist and are known to those skilled in the art. The microprocessor 112 is connected to a memory device 114 that includes computer readable memory that is capable of holding computer executable commands used by the microprocessor 112 to control data and/or input/output functions. Memory 114 can also store data that is manipulated by the microprocessor 112. The microprocessor 112 is also connected to either a storage device 116 or display device 118 or both. The storage device 116 and the display device 118 contain an embodiment of the invention as exemplified in earlier described figures and text showing field emission devices that are focused and shielded with the lens structure of the invention.

It should be noted that it would be obvious to those skilled in the art that many variations and modifications may be made to the disclosed embodiments without substantially departing from the invention. All such variations and modifications are intended to be included herein within the scope of the present invention, as set forth in the following claims.

What is claimed is:

1. An electrostatic lens for focusing electrons from a cathode to an anode, comprising:
    a first conductive layer having a first opening at a first distance from the cathode, the first conductive layer held at a first voltage; and
    a second conductive layer having a second opening at a second distance from the first conductive layer and a third distance to the anode layer, the second conductive layer held at a second voltage substantially equal to a voltage of the anode;
    wherein the first opening and the second opening are about the same diameter, the first voltage less than a voltage of the cathode that is less than the second voltage, the first distance is between one and one-half the sum of the second distance and the third distance to focus the electrons emitted from the cathode onto the anode to a spot size less than 40 nanometers.

2. The electron lens of claim 1 wherein the the second distance is the thickness of a dielectric layer disposed on the first conductive layer.

3. The electron lens of claim 1 wherein the third distance is equal to or less than about 2 micrometers.

4. The electron lens of claim 1 wherein the first and second openings have a diameter about 7.2 micrometers, and the first and second distances are about 5 micrometers.

5. The electron lens of claim 1 wherein the force created between the cathode and the anode is less than about 0.03 Newtons/cm$^2$.

6. The electron lens of claim 1 wherein the spot size is less than about 10 nanometers.

7. The electron lens of claim 1 wherein the sensitivity to lens and shield geometry due to fabrication process variations is minimized.

8. The electron lens of claim 1 wherein the difference between the first voltage and the second voltage is about 700 volts.

9. The electron lens of claim 1 wherein the first conductive layer and the second conductive layer are formed using semiconductor thin-film technology.

10. The electron lens of claim 1 wherein the cathode layer comprises at least one spindt-tip emitter.

11. The electron lens of claim 1 wherein the cathode comprises at least one flat emitter.

12. A focused electron emitter, comprising:
    a emitter layer at a first potential;
    a lens layer disposed over a first distance from the emitter layer having a first opening and second potential;
    a dielectric layer disposed on the lens layer; and
    a shield layer disposed over a second distance from the lens layer on the dielectric layer and having a second opening substantially the same diameter as the first opening and held at a third potential;
    wherein a focused electron beam is formed on an anode held at the third potential at a third distance from the shield layer.

13. The focused electron emitter of claim 12 wherein the sum of the second distance and the third distance is between about one to about two times the first distance.

14. The focused electron emitter of claim 12 wherein the emitter layer comprises at least one spindt-tip.

15. The focused electron emitter of claim 12 wherein the emitter layer comprises at least one flat emitter.

16. The focused electron emitter of claim 12 wherein the first distance and the second distance are substantially equal.

17. The focused electron emitter of claim 12 wherein the first distance is about 5 micrometers.

18. The focused electron emitter of claim 12 wherein the diameter of the first opening is about 7.2 micrometers.

19. The focused electron emitter of claim 12 wherein the force created between the emitter layer and the anode layer is less than 0.03 Newtons/cm$^2$.

20. The focused electron emitter of claim 12 wherein the focused beam creates a focused spot size of less than 40 nanometers on the anode.

21. The focused electron emitter of claim 12 wherein the focused beam creates a focused spot size of less than 10 nanometers on the anode.

22. The focused electron emitter of claim 12 wherein the difference between the first potential and the second potential is greater than 500 volts.

23. The focused electron emitter of claim 12 wherein the third distance is equal to or less than about 2 micrometers.

24. A mass storage device comprising at least one focused electron emitter of claim 12.

25. An electronic device comprising at least one mass storage device of claim 24.

26. A display device comprising at least one focused electron emitter of claim 12.

27. An electronic device comprising at least one display device of claim 26.

28. A field emission device for creating a focused electron beam on an anode, comprising:
    a cathode layer having at least one electron emitter;
    a first dielectric layer disposed on the cathode layer;
    a focusing lens including,
        a lens layer disposed on the first dielectric layer;
        a second dielectric layer disposed on the lens layer; and
        a shield layer disposed on the second dielectric layer and interposed between the lens layer and the anode, the shield layer at about the same potential as the anode wherein the electrostatic attraction between the lens layer and the anode is reduced.

29. The field emission device of claim 28 wherein the sum of the distance between the lens layer and the shield layer and the distance between the shield layer and the anode is between about one to about two times the distance between the lens layer and the cathode layer.

30. The field emission device of claim 28 wherein the distance of the lens layer from the cathode layer and the distance of the shield layer from the lens layer are substantially equal.

31. The field emission device of claim 28 wherein distance of the lens layer from the cathode layer is about 5 micrometers.

32. The field emission device of claim 28 wherein lens layer and the shield layer include an opening for creating the focused electron beam, the openings having substantially the same diameter.

33. The field emission device of claim 32 wherein the diameter of the opening in the lens layer is about 7.2 micrometers.

34. The field emission device of claim 28 wherein the force created between the cathode layer and the anode is less than 0.03 Newtons/cm$^2$.

35. The field emission device of claim 28 wherein the focused electron beam creates a focused spot size of less than 40 nanometers on the anode.

36. The field emission device of claim 28 wherein the focused electron beam creates a focused spot size of less than 10 nanometers on the anode.

37. The field emission device of claim 28 wherein lens layer and the shield layer have a voltage potential difference greater than 500 volts.

38. The field emission device of claim 28 wherein the distance between the shield layer and the anode is equal to or less than about 2 micrometers.

39. A mass storage device comprising at least one field emission device of claim 28.

40. An electronic device comprising at least one mass storage device of claim 39.

41. A display device comprising at least one field emission device of claim 28.

42. An electronic device comprising at least one display device of claim 41.

43. A field emission device for creating a focused electron beam on an anode, comprising:

means for creating a source of electrons;

means for focusing the source of electrons on the anode;

a dielectric layer disposed on the means for focusing; and means for shielding the means for focusing from the anode to reduce electrostatic attraction forces by having the means for shielding at about the same potential as the anode, said means for shielding disposed on the dielectric layer between the means for focusing and the anode.

44. The field emission device of claim 43 wherein the sum of the distance between the means for focusing and the means for shielding and the distance between the means for shielding and the anode is about one to about two times the distance between the means for focusing and the means for creating a source of electrons.

45. The field emission device of claim 43 wherein the distance between the means for creating and the means for focusing and the distance between the means for focusing and the means for shielding are substantially equal.

46. The field emission device of claim 43 wherein the distance between the means for creating and the means for focusing is about 5 micrometers.

47. The field emission device of claim 43 wherein the means for focusing and the means for shielding include a first opening and a second opening having substantially the same diameter.

48. The field emission device of claim 43 wherein the means for focusing includes an opening having a diameter of about 7.2 micrometers.

49. The field emission device of claim 43 wherein the force created between the means for shielding and the means for creating is less than 0.03 Newtons/cm$^2$.

50. The field emission device of claim 43 wherein the focused beam creates a focused spot size of less than 40 nanometers on the anode.

51. The field emission device of claim 43 wherein the focused beam creates a focused spot size of less than 10 nanometers on the anode.

52. The field emission device of claim 43 wherein the means for focusing has a first potential and the means for shielding has a second potential substantially equal to the potential of the anode, and wherein the difference between the first potential and the second potential is greater than 500 volts.

53. The field emission device of claim 43 wherein the distance between the means for shielding and the anode is equal to or less than about 2 micrometers.

54. A mass storage device comprising at least one field emission device of claim 43.

55. An electronic device comprising at least one mass storage device of claim 54.

56. A display device comprising at least one field emission device of claim 43.

57. An electronic device comprising at least one display device of claim 56.

58. A method of making an electron lens for an electron emitting cathode for focusing an electron beam on an anode, comprising the steps of:

creating a lens layer a first distance from the electron emitting cathode, the lens layer having a first opening substantially centered over the electron emitting cathode;

creating a dielectric layer on the lens layer; and creating a shield layer a second distance from the lens layer disposed on the dielectric layer and a third distance from the anode, the shield layer having a second opening substantially aligned with the first opening, wherein the sum of the second distance and the third distance is between about one to about two times the first distance.

59. The method of claim 58 wherein the first distance is substantially equal to the second distance.

60. The method of claim 58 wherein the first distance is about 5 micrometers.

61. The method of claim 58 wherein the third distance is equal to or less than about 2 micrometers.

62. The method of claim 58 wherein the diameter of the first opening is about 7.2 micrometers.

* * * * *